US012636612B2

(12) United States Patent
Lee et al.

(10) Patent No.: US 12,636,612 B2
(45) Date of Patent: May 26, 2026

(54) GAS TREATMENT SYSTEM, SEMICONDUCTOR PROCESS SYSTEM INCLUDING THE SAME, AND GAS TREATMENT METHOD USING THE SAME

(71) Applicant: Samsung Electronics Co., Ltd., Suwon-si (KR)

(72) Inventors: Wonsu Lee, Suwon-si (KR); Hyunseok Kim, Suwon-si (KR); Jungdae Park, Suwon-si (KR); Kimoon Lee, Suwon-si (KR); Jong-San Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 345 days.

(21) Appl. No.: 18/230,880

(22) Filed: Aug. 7, 2023

(65) Prior Publication Data

US 2024/0042385 A1 Feb. 8, 2024

(30) Foreign Application Priority Data

Aug. 8, 2022 (KR) ........................ 10-2022-0098805
Jan. 16, 2023 (KR) ........................ 10-2023-0006371

(51) Int. Cl.
*B01D 53/88* (2006.01)
*B01D 53/86* (2006.01)
*H10P 72/00* (2026.01)

(52) U.S. Cl.
CPC ......... *B01D 53/885* (2013.01); *B01D 53/869* (2013.01); *H10P 72/0421* (2026.01); *B01D 2255/9032* (2013.01); *B01D 2258/0216* (2013.01)

(58) Field of Classification Search
CPC ........ B01D 53/86; B01D 53/88; B01D 53/75; B01D 53/78; B01D 53/83; B01D 53/8659; B01D 53/869; B01D 53/885
See application file for complete search history.

(56) References Cited

U.S. PATENT DOCUMENTS

| | | | | |
|---|---|---|---|---|
| 4,869,207 | A * | 9/1989 | Engstrom | F23C 10/10 110/216 |
| 5,480,524 | A | 1/1996 | Oeste | |
| 5,773,549 | A | 6/1998 | Moser et al. | |
| 6,106,790 | A * | 8/2000 | Hsiung | B01D 53/685 423/239.1 |
| 6,468,490 | B1 * | 10/2002 | Shamouilian | B01D 53/75 423/241 |
| 7,985,379 | B2 * | 7/2011 | Chiu | F23M 5/085 422/168 |

(Continued)

FOREIGN PATENT DOCUMENTS

| | | |
|---|---|---|
| JP | 2002-45652 A | 2/2002 |
| KR | 10-0743399 B1 | 7/2007 |

(Continued)

*Primary Examiner* — Sharon Pregler
(74) *Attorney, Agent, or Firm* — Sughrue Mion, PLLC

(57) ABSTRACT

A gas treatment system includes a first scrubber configured to treat a gas exhausted from a process chamber, a catalytic reactor connected to the first scrubber and configured to treat a gas passing through the first scrubber, and a second scrubber connected to the catalytic reactor and configured to treat a gas passing through the catalytic reactor, where the catalytic reactor includes a fluidized bed reactor (FBR).

8 Claims, 18 Drawing Sheets

(56)     References Cited

U.S. PATENT DOCUMENTS

| 2009/0142244 A1 | 6/2009 | Kanno et al. |
| 2020/0147541 A1 | 5/2020 | Ahn et al. |
| 2020/0179902 A1 | 6/2020 | Huang |
| 2023/0274952 A1 | 8/2023 | Lee et al. |

FOREIGN PATENT DOCUMENTS

| KR | 10-0766749 B1 | 10/2007 |
| KR | 10-1102230 B1 | 1/2012 |
| KR | 10-1521389 B1 | 5/2015 |
| KR | 10-1553178 B1 | 10/2015 |
| KR | 10-1825825 B1 | 2/2018 |
| KR | 10-1939609 B1 | 1/2019 |
| KR | 10-2021-0136249 A | 11/2021 |
| KR | 10-2022-0012193 A | 2/2022 |
| KR | 10-2023-0128229 A | 9/2023 |
| WO | 2017/126932 A1 | 7/2017 |

* cited by examiner

FIG. 7

GAS TREATMENT SYSTEM, SEMICONDUCTOR PROCESS SYSTEM INCLUDING THE SAME, AND GAS TREATMENT METHOD USING THE SAME

CROSS-REFERENCE TO RELATED APPLICATIONS

This application is based on and claims priority to Korean Patent Application No. 10-2023-0006371, filed on Jan. 16, 2023, and Korean Patent Application No. No. 10-2022-0098805, filed on Aug. 8, 2022, in the Korean Intellectual Property Office, the disclosures of which are incorporated herein by reference in their entireties.

BACKGROUND

1. Field

Example embodiments of the disclosure relate to a gas treatment system, a semiconductor process system including the same, and a gas treatment method using the same.

2. Description of Related Art

A semiconductor device may be fabricated using various processes. For example, a semiconductor device may be manufactured by allowing a silicon wafer to undergo a photolithography process, an etching process, a deposition process, etc. Various chemical substances may be used in such processes. The chemical substance may be exhausted in gaseous state. It may be required that the chemical substance be treated before exhaustion from semiconductor process facilities to the atmosphere, as the exhausted gas may include harmful substances. A scrubber and a catalytic reactor may be used for the exhaustion of the chemical substance.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a gas treatment system capable of achieving continuous operation by exchanging catalysts during equipment operation, a semiconductor process system including the same, and a gas treatment method using the same.

One or more example embodiments provide a gas treatment system capable of treating various kinds of gas exhausted from any type of process chamber, a semiconductor process system including the same, and a gas treatment method using the same.

One or more example embodiments provide a gas treatment system capable of increasing efficiency of gas treatment, a semiconductor process system including the same, and a gas treatment method using the same.

One or more example embodiments provide a gas treatment system capable of adjusting a temperature of gas before treatment process, a semiconductor process system including the same, and a gas treatment method using the same.

Additional aspects will be set forth in part in the description which follows and, in part, will be apparent from the description, or may be learned by practice of the presented embodiments.

According to an aspect of an example embodiment, a gas treatment system may include a first scrubber configured to treat a gas exhausted from a process chamber, a catalytic reactor connected to the first scrubber and configured to treat a gas passing through the first scrubber, and a second scrubber connected to the catalytic reactor and configured to treat a gas passing through the catalytic reactor, where the catalytic reactor may include a fluidized bed reactor (FBR).

According to an aspect of an example embodiment, a semiconductor process system may include a first process chamber configured to perform a first process on a substrate, a second process chamber configured to perform a second process different from the first process, and a gas treatment system configured to treat a gas exhausted from each of the first process chamber and the second process chamber, where the gas treatment system may include a catalytic reactor connected to the first process chamber and configured to treat a gas exhausted from the first process chamber, a scrubber connected to the catalytic reactor and configured to treat a gas passing through the catalytic reactor, and a combustion apparatus connected to the second process chamber and configured to burn a gas exhausted from the second process chamber, where the catalyst flow member may include a filter structure configured to allow a gas to pass through the filter structure and to prevent a catalyst from passing through the filter structure, and where the catalyst flow member may divide the reaction space into a gas inlet space and a gas outlet space.

According to an aspect of an example embodiment, a gas treatment method may include treating a gas exhausted from a first process chamber with a first scrubber, treating the gas passing through the first scrubber with a catalytic reactor, and treating the gas passing through the catalytic reactor with a second scrubber, where the catalytic reactor may include a fluidized catalytic bed reactor, and where the treating the gas passing through the first scrubber with the catalytic reactor may include eliminating a portion of a first catalyst from the catalytic reactor while the gas passes through the catalytic reactor and introducing a second catalyst into the catalytic reactor while the gas passes through the catalytic reactor.

BRIEF DESCRIPTION OF DRAWINGS

The above and other aspects, features, and advantages of certain example embodiments of the present disclosure will be more apparent from the following description taken in conjunction with the accompanying drawings, in which:

FIG. 7 is a cross-sectional view of a process chamber according to embodiments of the disclosure;

DETAILED DESCRIPTION OF EMBODIMENTS

Figure 1:
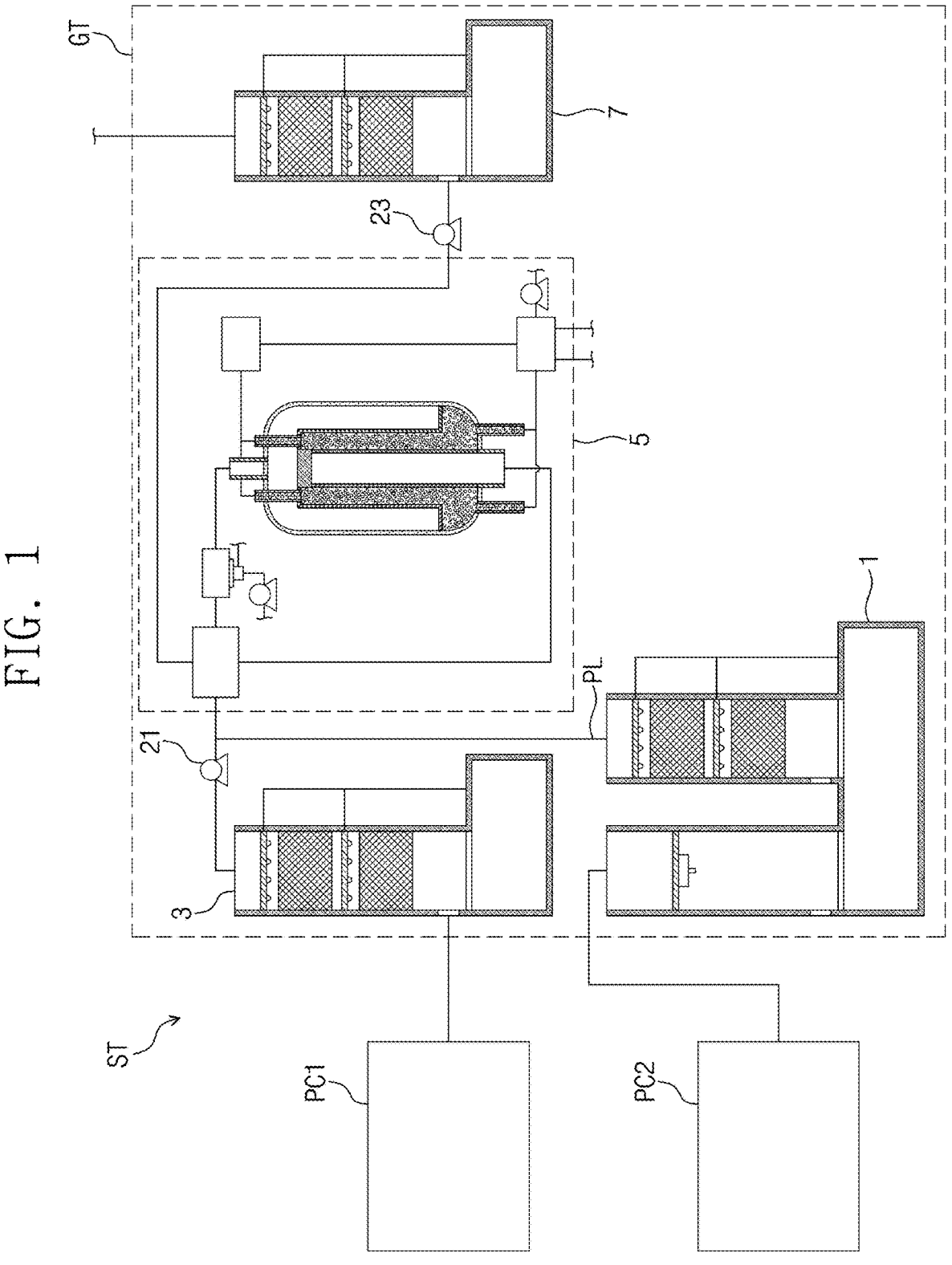
FIG. 1 is a diagram of a semiconductor process system according to embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram of a semiconductor process system according to embodiments of the disclosure.

Referring to FIG. 1, a semiconductor process system ST may be provided. The semiconductor process system ST may perform a semiconductor fabrication process. For example, the semiconductor process system ST may perform a process on a substrate. A term "substrate" used herein may denote a silicon wafer, but the disclosure is not limited thereto. The semiconductor process system ST may use fluid to perform the semiconductor fabrication process. The semiconductor process system ST may process fluid exhausted after being used in the semiconductor fabrication process. The semiconductor process system ST may include a process chamber and a gas treatment system GT.

The process chamber may perform a process on a substrate. The process chamber may perform various kinds of processes. For example, the process chamber may perform a deposition process, an etching process, an exposure process, a cleaning process, and a test process on a substrate. Various chemical substances may be used in the process chamber. Therefore, a gas exhausted from the process chamber may contain different kinds of chemical substances. For example, the gas exhausted from the process chamber may include a perfluorinated compound (PFC). The gas exhausted from the process chamber may include $SF_6$, $CF_4$, and/or $C_2F_6$. Alternatively, the gas exhausted from the process chamber may include a nitrogen compound. A detailed description thereof will be further provided below.

The semiconductor process system ST may include a plurality of process chambers. For example, as shown in FIG. 1, there may be provided a first process chamber PC1 and a second process chamber PC2. The first process chamber PC1 and the second process chamber PC2 may perform different kinds of processes. For example, the first process chamber PC1 may perform an etching process on a substrate. The second process chamber PC2 may perform a deposition process on a substrate. A detailed description thereof will be further provided below.

The gas treatment system GT may treat a fluid exhausted from the process chamber. The gas treatment system GT may eliminate a harmful substance in the gas. For example, the gas treatment system GT may remove a harmful substance in the gas exhausted from the process chamber. The gas treatment system GT may be connected to the process chamber.

The gas treatment system GT may decompose the PFC in the gas exhausted from the process chamber. The disclosure, however, are not limited thereto, and the gas treatment system GT may be used to treat other substances in the gas. For example, the gas treatment system GT may treat a nitrogen compound in the gas. The gas treatment system GT may include a combustion apparatus 1, a first scrubber 3, a catalytic reactor 5, and a second scrubber 7. The combustion apparatus 1, the first scrubber 3, a catalytic reactor 5, and the second scrubber 7 may be connected through a gas line. The gas exhausted from the process chamber may sequentially pass through and be treated by the combustion apparatus 1, the first scrubber 3, the catalytic reactor 5, and the second scrubber 7. A detailed description thereof will be further provided below.

A blower may be installed on the gas line. The blower may accelerate gas in the gas line. The gas treatment system may include a plurality of blowers. For example, a first blower 21 and a second blower 23 may be provided. The first blower 21 may be positioned between the first scrubber 3 and the catalytic reactor 5. The first blower 21 may accelerate the gas released from the first scrubber 3 toward the catalytic reactor 5. The second blower 23 may be positioned between the catalytic reactor 5 and the second scrubber 7. The second blower 23 may accelerate the gas released from the catalytic reactor 5 toward the second scrubber 7. A detailed description thereof will be further provided below.

The first scrubber 3 may be connected to the first process chamber PC1. The first scrubber 3 may treat the gas exhausted from the first process chamber PC1. The first scrubber 3 may be, for example, a wet scrubber. A detailed description thereof will be further provided below.

The catalytic reactor 5 may be connected to the first scrubber 3. The catalytic reactor 5 may treat the gate that has passed through the first scrubber 3. The catalytic reactor 5 may use a catalyst to treat the gas. The catalytic reactor 5 may be, for example, a fluidized bed reactor (FBR). The FBR may refer to a device in which a catalyst is moved and exchanged during a gas treatment process. A various types of FBR may be provided. A detailed description thereof will be further provided below.

The second scrubber 7 may be connected to the catalytic reactor 5. The second scrubber 7 may treat the gat that has passed through the catalytic reactor 5. The second scrubber 7 may be, for example, a wet scrubber. A detailed description thereof will be further provided below.

The combustion apparatus 1 may be connected to the second process chamber PC2. The combustion apparatus 1 may treat the gas exhausted from the second process chamber PC2. For example, the combustion apparatus 1 may burn the gas exhausted from the second process chamber PC2. The second process chamber PC2 may be connected through a connection line to the catalytic reactor 5. Therefore, the gas that has passed through the combustion apparatus 1 may move through the gas line PL to the catalytic reactor 5.

Figure 2:
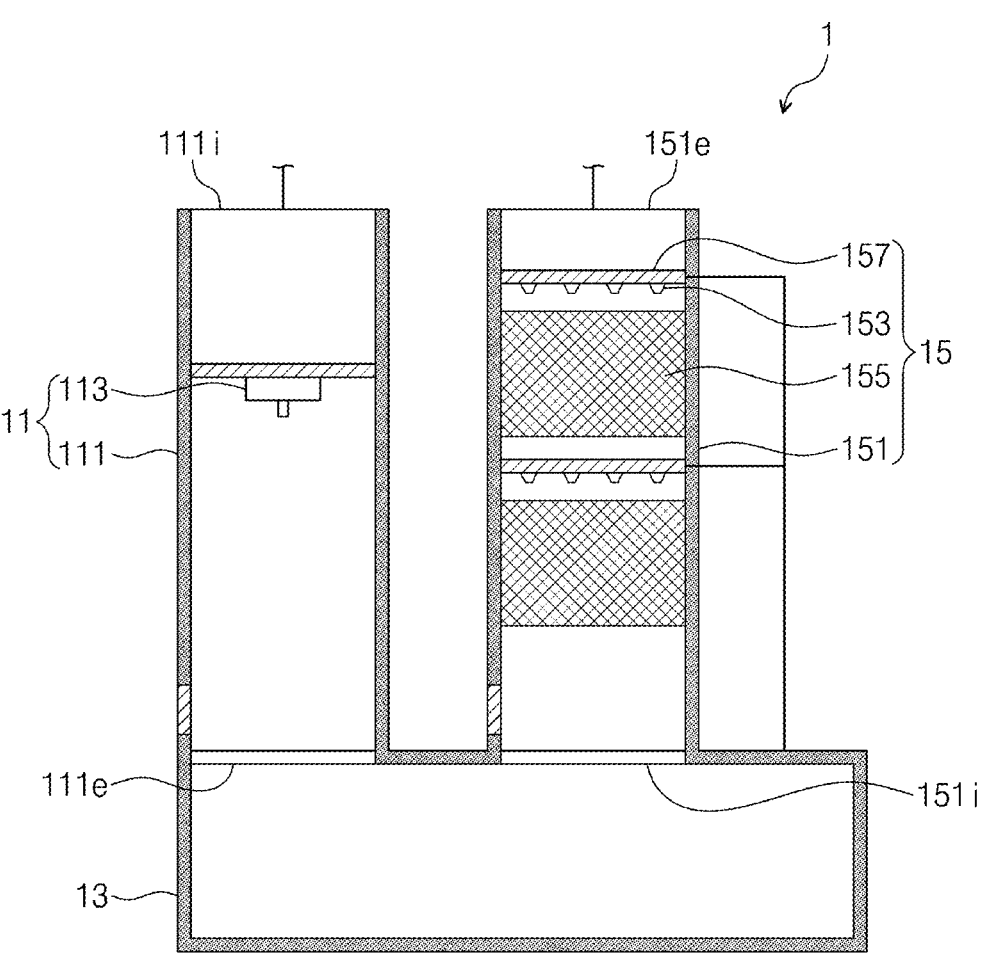
FIG. 2 is a cross-sectional view of a combustion apparatus according to embodiments of the disclosure.

FIG. 2 is a cross-sectional view of a combustion apparatus according to embodiments of the disclosure.

Figure 10:
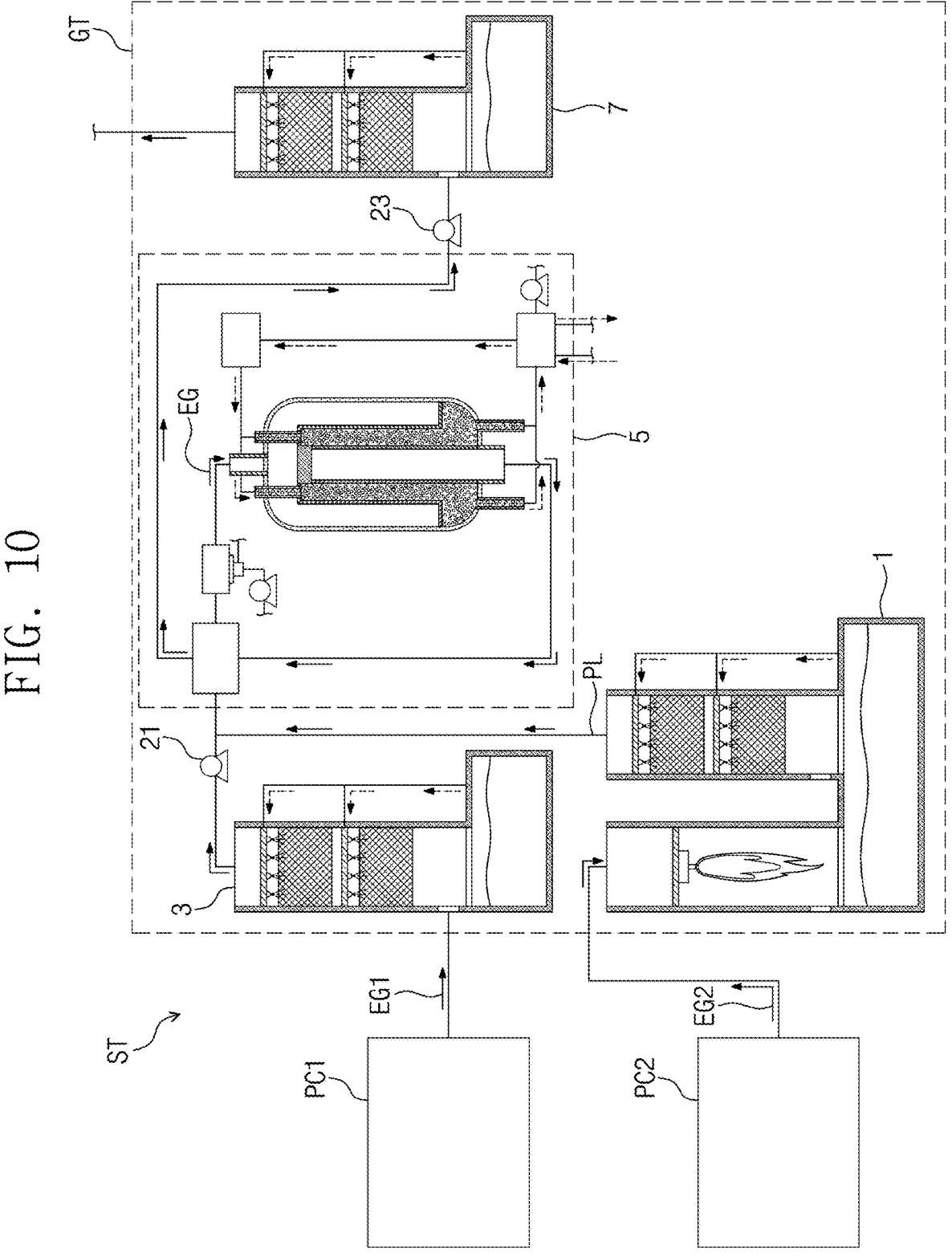
FIGS. 10, 11, 12, 13 and 14 are diagrams of the gas treatment method according to the flowchart of FIG. 9 according to embodiments of the disclosure.

Referring to FIG. 2, the combustion apparatus 1 may treat the gas exhausted from the second process chamber (e.g., PC2 of FIG. 10. For example, the combustion apparatus 1 may burn the gas exhausted from the second process chamber PC2. The gas released from the second process chamber PC2 may include a nitrogen-based compound, an inflammable material, and/or a toxic material. For example, the gas released from the second process chamber PC2 may include $NF_3$, $N_2O$, and $H_2$. An inflammable materials and/or a toxic material may be burned in the combustion apparatus 1. The combustion apparatus 1 may include a burner. The combustion apparatus 1 may include, for example, a burn-wet scrubber. The burn-wet scrubber may be a type of scrubber that burns gas and then sprays cleaning water. For example, as shown in FIG. 2, the combustion apparatus 1 may include a burning section 11, a connection section 13, and a cleaning section 15.

The burning section 11 may burn the gas. The burning section 11 may include a combustion housing 111 and a burner 113. The combustion housing 111 may provide a combustion inlet 111*i* and a combustion outlet 111*e*. The burner 113 may be positioned in the combustion housing 111. The burner 113 may produce flame. The gas may be burned by the flame produced from the burner 113.

The connection section 13 may connect the burning section 11 to the cleaning section 15. For example, the connection section 13 may be connected to the combustion outlet 111*e*. The gas burned in the burning section 11 may move through the connection section 13 to the cleaning section 15.

The cleaning section 15 may spray cleaning water to the gas burned in the burning section 11. The cleaning section 15 may include a cleaning housing 151, a nozzle 153, a nozzle support member 157, and a packing member 155. The cleaning housing 151 may provide a cleaning inlet 151*i* and a cleaning outlet 151*e*. The cleaning housing 151 may be connected through the connection section 13 to the burning section 11. The nozzle 153 may be positioned in the cleaning housing 151. The nozzle 153 may spray the cleaning water. The nozzle support member 157 may support the nozzle 153. The packing member 155 may be positioned below the nozzle 153. The packing member 155 may have a porous structure.

It is illustrated and explained that the combustion apparatus 1 is a burn-wet scrubber, but the disclosure is not limited thereto. For example, the combustion apparatus 1 may be of another type capable of burning an inflammable material.

Figure 3:
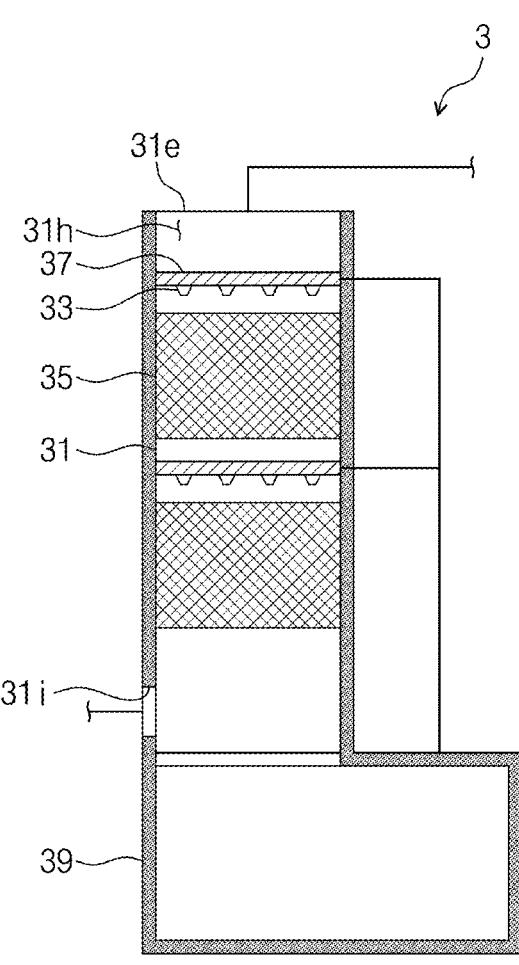
FIG. 3 is a cross-sectional view of a scrubber according to embodiments of the disclosure.

FIG. 3 is a cross-sectional view of a scrubber according to embodiments of the disclosure.

Referring to FIG. 3, the first scrubber 3 may eliminate a specific constituent from the gas. The first scrubber 3 may include a first cleaning housing 31, a first cleaning nozzle 33, a first packing member 35, a first nozzle support member 37, and a first cleaning water tank 39.

The first cleaning housing 31 may provide a first cleaning space 31*h* that extends vertically. The gas may be introduced through a first cleaning inlet 31*i* to the first cleaning space 31*h*. The gas may rise upwardly along the first cleaning housing 31. In addition, the gas may be discharged through the first cleaning outlet 31*e* from the first cleaning space 31*h*.

The first cleaning nozzle 33 may be positioned in the first cleaning housing 31. The first cleaning nozzle 33 may spray the cleaning water into the first cleaning space 31*h*. For example, the first cleaning nozzle 33 may spray the cleaning water toward the gas in the first cleaning housing 31. The cleaning water sprayed from the first cleaning nozzle 33 may eliminate a specific substance in the gas that passes through the first cleaning space 31*h*. For example, the cleaning water may eliminate HF, HCl, and/or $F_2$ in the gas. The cleaning water may be water ($H_2O$) and/or NaOH aqueous solution. A detailed description thereof will be further provided below. The first scrubber 3 may include a plurality of cleaning nozzles. In the description below, a single first cleaning nozzle 33 will be discussed for convenience.

The first packing member 35 may be positioned in the first cleaning housing 31. The first packing member 35 may be positioned below the first cleaning nozzle 33. The first packing member 35 may provide a pathway through which fluid passes. A flow direction of the gas and the cleaning water may be changed while passing through the first packing member 35. The first packing member 35 may increase a contact area between the gas and the cleaning water.

The first nozzle support member 37 may support the first cleaning nozzle 33. The first nozzle support member 37 may provide the first cleaning nozzle 33 with the cleaning water.

The first cleaning water tank 39 may be positioned below the first cleaning housing 31. The first cleaning water tank 39 may collect the cleaning water sprayed from the first cleaning nozzle 33. The cleaning water collected in the first cleaning water tank 39 may be provided back to the first cleaning nozzle.

The second scrubber (e.g., 7 of FIG. 1) may have a similar configuration to that of the first scrubber.

Figure 4:
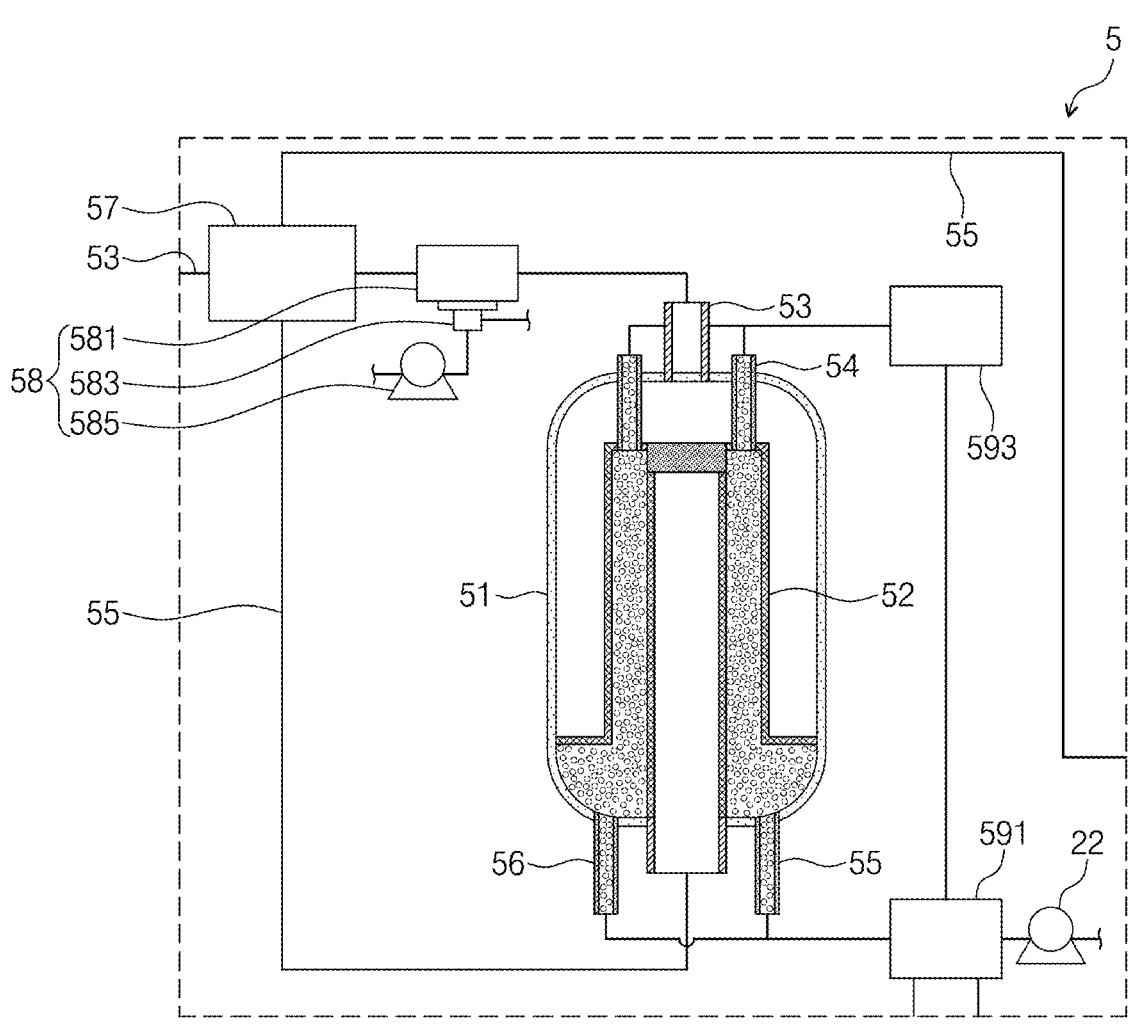
FIG. 4 a cross-sectional view of a catalytic reactor according to embodiments of the disclosure.
Figure 5:
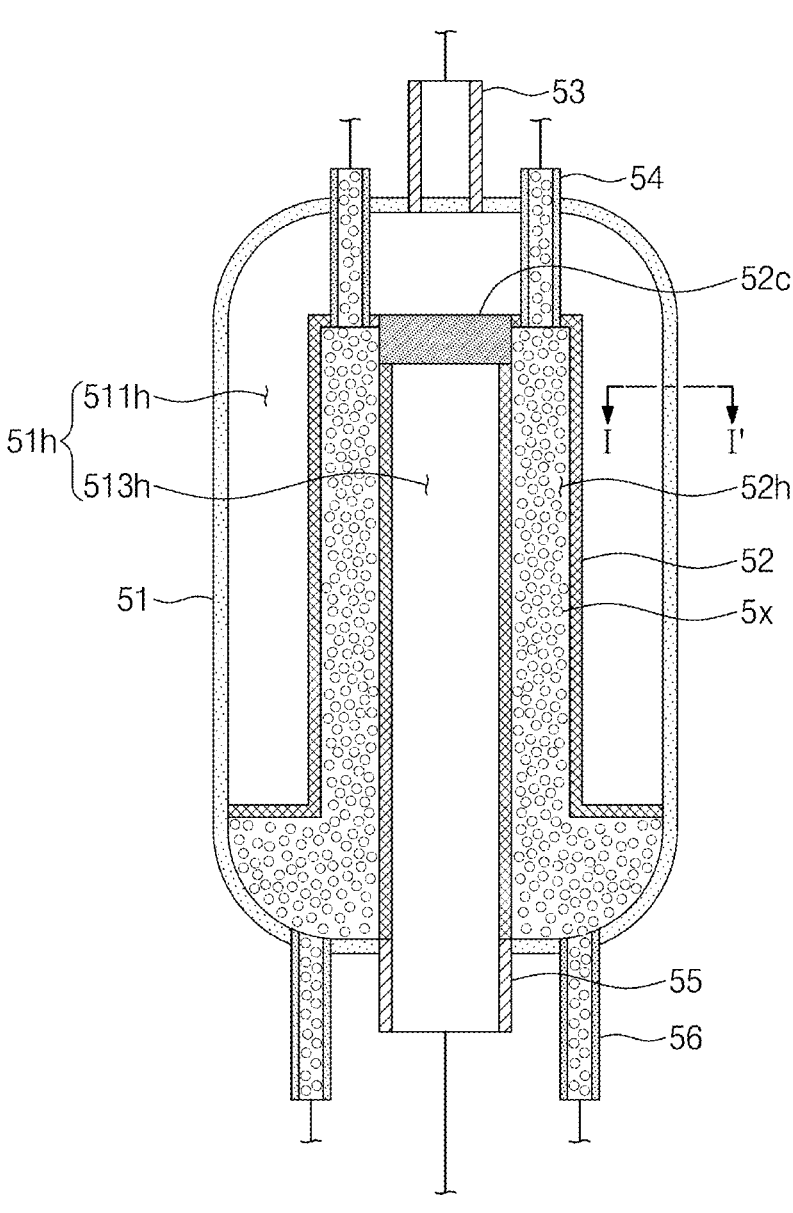
FIG. 5 illustrates a cross-sectional view of a catalytic reactor according to embodiments of the disclosure.

FIG. 4 a cross-sectional view of a catalytic reactor according to embodiments of the disclosure. FIG. 5 illustrates a cross-sectional view of a catalytic reactor according to embodiments of the disclosure.

Referring to FIGS. 4 and 5, the catalytic reactor 5 may include a catalytic reaction housing 51, a gas inlet line 53, a gas outlet line 55, a combustion chamber 58, a pre-heater 57, a catalyst flow member 52, a catalyst supply line 54, a catalyst exhaust line 56, a catalyst mixing apparatus 591, and a catalyst supply apparatus 593.

The catalytic reaction housing 51 may provide a reaction space 51*h*. The gas may be treated in the reaction space 51*h*. The catalyst flow member 52 may divide the reaction space 51*h* into a gas inlet space 511*h* and a gas outlet space 513*h*. A detailed description thereof will be further provided below.

The gas inlet line 53 may be connected to the catalytic reaction housing 51. For example, the gas inlet line 53 may be connected to the catalytic reaction housing 51 and thereby connected to the reaction space 51*h*. The gas inlet line 53 may be connected to the gas inlet space 511*h*. As shown in FIG. 5, an end of the gas inlet line 53 may be connected at (e.g., integrated with) an upper side of the catalytic reaction housing 51. The gas that has passed through the first scrubber (e.g., 3 of FIG. 1) may be introduced through the gas inlet line 53 to the reaction space 51*h*.

The gas outlet line 55 may be connected to the catalytic reaction housing 51. For example, the gas outlet line 55 may be connected to the catalytic reaction housing 51 and thereby connected to the reaction space 51*h*. The gas outlet line 55 may be connected to the gas outlet space 513*h*. As shown in FIG. 5, an end of the gas outlet line 55 may be connected at (e.g., integrated with) a lower side of the catalytic reaction housing 51. The gas may be exhausted through the gas outlet line 55 from the reaction space 51*h*.

The combustion chamber 58 may be positioned on the gas inlet line 53. The combustion chamber 58 may heat the gas that passes through the gas inlet line 53. The combustion chamber 58 may include a combustion chamber housing 581, a heating burner 583, and a third blower 585. The combustion chamber housing 581 may be positioned on the gas inlet line 53. In some embodiments, a space in the gas inlet line 53 may be spatially connected to a space in the combustion chamber housing 581. The gas in the gas inlet line 53 may move into the combustion chamber housing 581. Alternatively, the combustion chamber housing 581 may surround the gas inlet line 53. The heating burner 583 may heat the gas in the combustion chamber housing 581. The heating burner 583 may be supplied with fuel such as liquefied natural gas (LNG). The third blower 585 may introduce air into the heating burner 583. The heating burner 583 may mix the fuel and the air introduced through the third blower 585.

The pre-heater 57 may be positioned on the gas outlet line 55. For example, the gas outlet line 55 may pass through the pre-heater 57. In addition, the pre-heater 57 may be positioned on the gas inlet line 53. For example, the gas inlet line 53 may pass through the pre-heater 57. Therefore, the gas inlet line 53 and the gas outlet line 55 may intersect each other in the pre-heater 57. In the pre-heater 57, heat exchange may be provided between the gas in the gas inlet line 53 and the gas in the gas outlet line 55. For example, in the pre-heater 57, heat transfer may occur from the gas in the gas outlet line 55 to the gas inlet line 53. Therefore, a temperature of the gas in the gas outlet line 55 may decrease while the gas passes through the pre-heater 57. A temperature of the gas in the gas inlet line 53 may increase while the gas passes through the pre-heater 57.

In some embodiments, on the gas inlet line 53, the combustion chamber 58 may be disposed closer than the pre-heater 57 to the catalytic reaction housing 51. Therefore, the gas that passes through the gas inlet line 53 may be introduced into the catalytic reaction housing 51 after sequentially passing through the pre-heater 57 and the combustion chamber 58. For example, the gas released from the first scrubber (e.g., 3 of FIG. 1) may be firstly heated in the pre-heater 57 and then may be secondly heated in the combustion chamber 58. Thus, fuel consumed in the combustion chamber 58 may be saved.

The catalyst flow member 52 may be positioned in the catalytic reaction housing 51. The catalyst flow member 52 may provide a catalyst flow space 52h. A catalyst may be disposed in the catalyst flow member 52. The catalyst 5x may include a catalyst for decomposition reaction of the PFC. For example, the catalyst 5x may include Co or $ZrO_2$—$Al_2O_3$, but the disclosure is not limited thereto. The catalyst 5x may have a powder form and/or a particle form having a certain size or more. The catalyst flow member 52 may divide the reaction space 51h into the gas inlet space 511h and the gas outlet space 513h.

The catalyst flow member 52 may have a filter structure. Therefore, the gas may pass through the catalyst flow member 52. For example, the gas may pass through the catalyst flow member 52 to enter the catalyst flow space 52h. In addition, the gas may pass through the catalyst flow member 52 to escape from the catalyst flow space 52h. The catalyst may not pass through the catalyst flow member 52. For example, the catalyst 5x in the catalyst flow member 52 may not be introduced into the reaction space 51h from the catalyst flow space 52h.

The catalyst supply line 54 may be connected to the catalytic reaction housing 51. For example, the catalyst supply line 54 may be combined with an upper side of the catalytic reaction housing 51. The catalyst supply line 54 may be connected to one end of the catalyst flow member 52. A catalyst supplied along the catalyst supply line 54 may be introduced into the catalyst flow space 52h within the catalyst flow member 52.

The catalyst exhaust line 56 may be connected to the catalytic reaction housing 51. For example, the catalyst exhaust line 56 may be connected to a lower side of the catalytic reaction housing 51. The catalyst exhaust line 56 may be connected to another end of the catalyst flow member 52. A catalyst positioned in the catalyst flow space 52h within the catalyst flow member 52 may be discharged along the catalyst exhaust line 56.

The catalyst mixing apparatus 591 may be connected to the catalyst exhaust line 56. A catalyst discharged along the catalyst exhaust line 56 may be introduced into the catalyst mixing apparatus 591. The catalyst mixing apparatus 591 may be supplied with a new catalyst. A catalyst supply line may be connected to the catalyst mixing apparatus 591. In addition, the catalyst mixing apparatus 591 may discharge a catalyst. A catalyst exhaust line may be connected to the catalyst mixing apparatus 591. A catalyst discharged from the catalyst exhaust line 56 and a new catalyst may be mixed in the catalyst mixing apparatus 591. The catalyst mixing apparatus 591 may be shaped like a mixer including a component such as a screw.

The catalyst supply apparatus 593 may be connected to the catalyst mixing apparatus 591. In addition, the catalyst supply apparatus 593 may be connected to the catalyst supply line 54. A catalyst mixed in the catalyst mixing apparatus 591 may be supplied from the catalyst supply apparatus 593 through the catalyst supply line 54 to the catalyst flow member 52.

Figure 6:
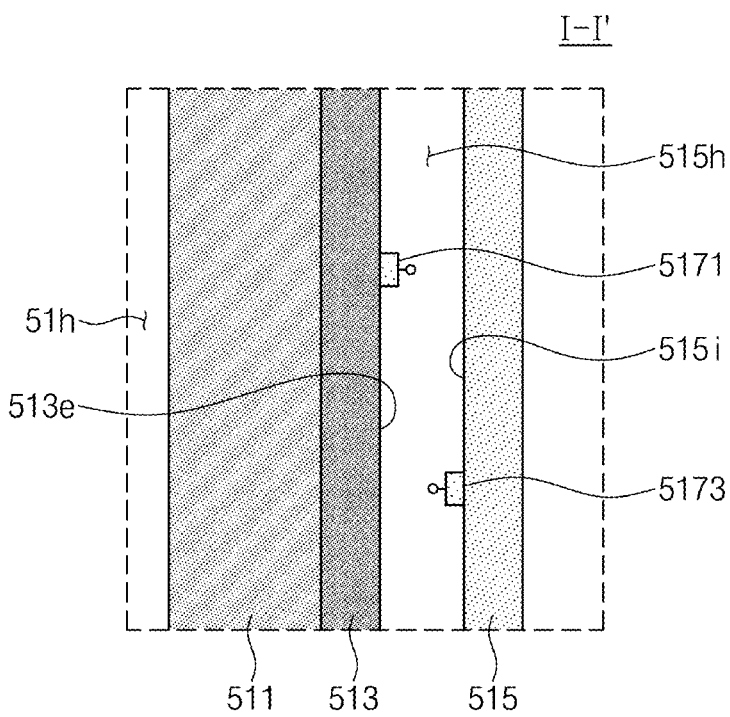
FIG. 6 is a diagram taken along line IT of FIG. 5 according to embodiments of the disclosure.

FIG. 6 is a diagram taken along line IT of FIG. 5 according to embodiments of the disclosure.

Referring to FIGS. 5 and 6, the catalytic reaction housing 51 may include an inner wall 511, a steel layer 513, an outer adiabatic layer 515, a first temperature sensor 5171, and a second temperature sensor 5173.

The inner wall 511 may define the reaction space 51h. The inner wall 511 may prevent corrosion of the steel layer 513. The inner wall 511 may include a castable refractory.

The steel layer 513 may be provided on an outside of the inner wall 511. The steel layer 513 may surround or at least partially surround the inner wall 511. The steel layer 513 may include carbon steel or stainless steel. For example, the steel layer 513 may include SAE 304 stainless steel. The steel layer 513 may have a thickness of about 6 mm to about 12 mm.

The outer adiabatic layer 515 may be positioned outside the steel layer 513. The outer adiabatic layer 515 may surround the steel layer 513. The outer adiabatic layer 515 may be spaced apart from the steel layer 513. Therefore, an adiabatic space 515h may be provided between an inner surface 515i of the outer adiabatic layer 515 and an outer surface 513e of the steel layer 513.

The first temperature sensor 5171 may be provided on the steel layer 513. The first temperature sensor 5171 may detect a surface temperature of the steel layer 513. When the first temperature sensor 5171 detects that the temperature of the steel layer 513 increases to a certain value or higher, an abnormal signal may be generated.

The second temperature sensor 5173 may be disposed in the adiabatic space 515h. The second temperature sensor 5173 may detect a temperature of the adiabatic space 515h. When the second temperature sensor 5173 detects that the temperature of the adiabatic space 515$h$ increases to a certain value or higher, an abnormal signal may be generated.

Figure 7:
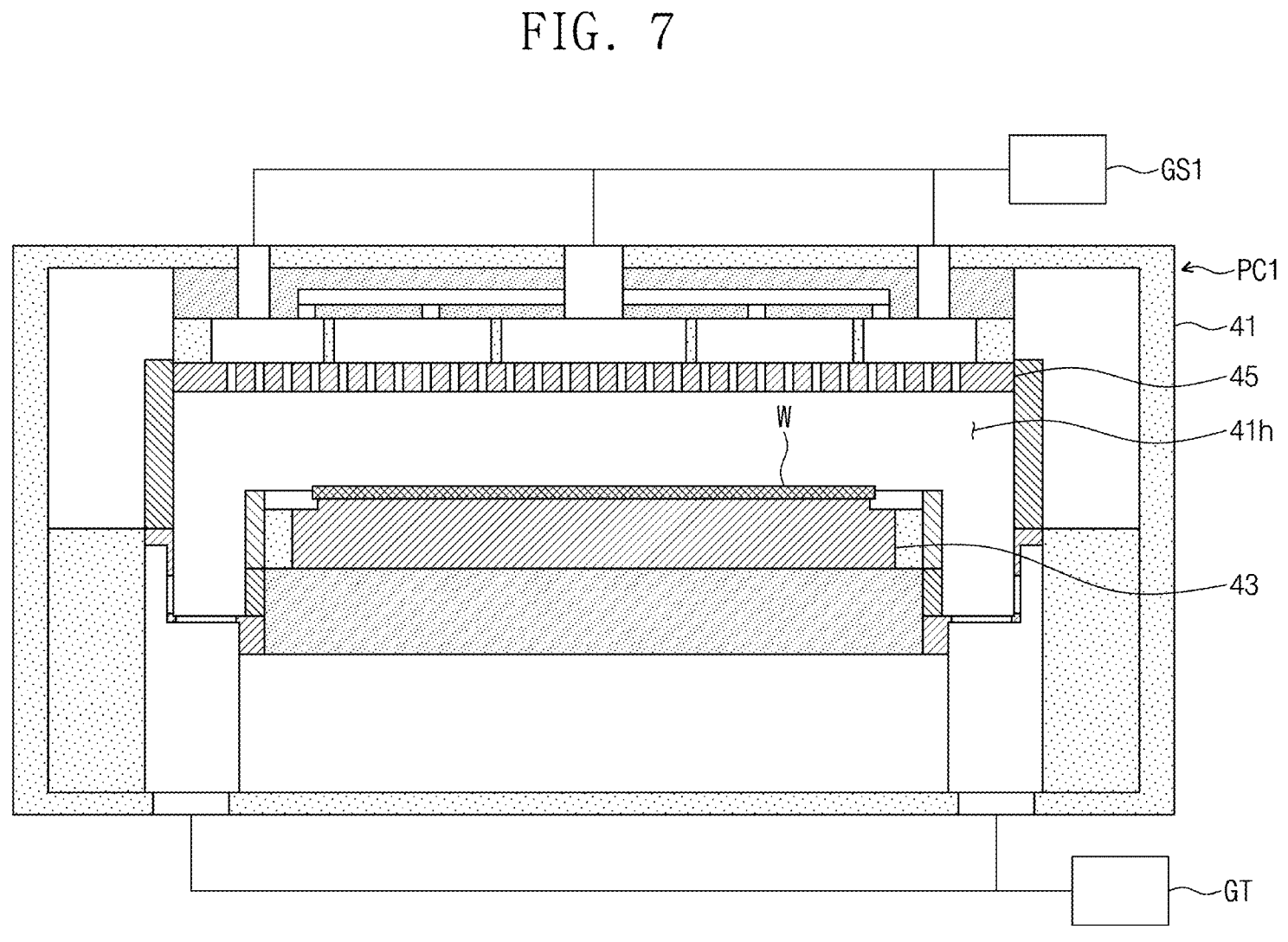

FIG. 7 is a cross-sectional view of a process chamber according to embodiments of the disclosure.

Referring to FIG. 7, the first process chamber PC1 may be an etching chamber in which an etching process is performed. The first process chamber PC1 may include an etching housing 41, an etching chuck 43, a showerhead 45, and a first gas supply section GS1.

The etching housing 41 may provide an etching space 41$h$. The etching chuck 43 may be positioned in the etching housing 41. The etching chuck 43 may support and/or fix a substrate W. The showerhead 45 may be upwardly spaced apart from the etching chuck 43. A gas may be distributed through the showerhead 45 to the etching chuck 43. The first gas supply section GS1 may supply the etching space 41$h$ with the gas through the showerhead 45. When the first process chamber PC1 performs a process on a substrate, the gas may be discharged. The gas discharged from the first process chamber PC1 may include a PFC. The gas used in the first process chamber PC1 may be discharged to the gas treatment system GT. For example, the gas discharged from the first process chamber PC1 may be treated while passing through the first scrubber (e.g., 3 of FIG. 1), the catalytic reactor (e.g., 5 of FIG. 1), and the second scrubber (e.g., 7 of FIG. 1).

It is explained that the first process chamber PC1 is an etching chamber, but the disclosure is not limited thereto. For example, the first process chamber PC1 may be a chamber configured to perform another kind of semiconductor process in which a PFC is discharged.

Figure 8:
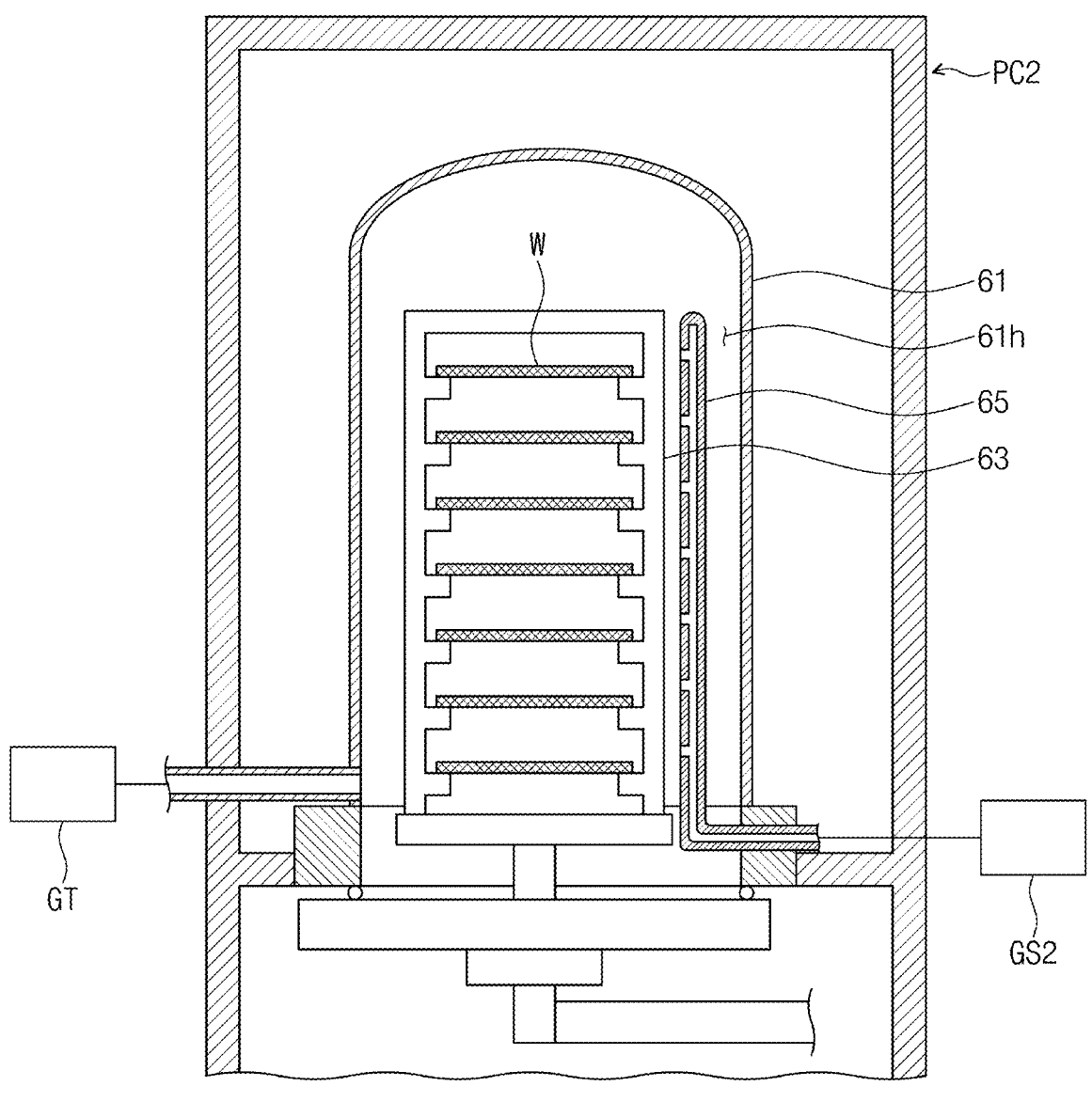
FIG. 8 illustrates a cross-sectional view of a process chamber according to embodiments of the disclosure.

FIG. 8 illustrates a cross-sectional view of a process chamber according to embodiments of the disclosure.

Referring to FIG. 8, the second process chamber PC2 may be a deposition chamber in which a deposition process is performed. The second process chamber PC2 may include a deposition housing 61, a boat 63, a gas nozzle 65, and a second gas supply section GS2.

The deposition housing 61 may provide a deposition space 61$h$. The boat 63 may be positioned in the deposition housing 61. The boat 63 may support and/or fix a substrate W. The gas nozzle 65 may be laterally spaced apart from the boat 63. A gas may be distributed through the gas nozzle 65 to the boat 63. A gas may be supplied from the second gas supply section GS2 through the gas nozzle 65 to the deposition space 61$h$. When the second process chamber PC2 performs a process on a substrate, the gas may be discharged. The gas discharged from the second process chamber PC2 may include a nitrogen-based compound, an inflammable material, and/or a toxic material. The gas used in the second process chamber PC2 may be discharged to the gas treatment system GT. For example, the gas discharged from the second process chamber PC2 may be treated while passing through the combustion apparatus (e.g., 1 of FIG. 1), the catalytic reactor (e.g., 5 of FIG. 1), and the second scrubber (e.g., 7 of FIG. 1).

It is explained that the second process chamber PC2 is a deposition chamber, but the disclosure is not limited thereto. For example, the second process chamber PC2 may be a chamber configured to perform another kind of semiconductor process that discharges a nitrogen-based compound, an inflammable material, and/or a toxic material.

Figure 9:
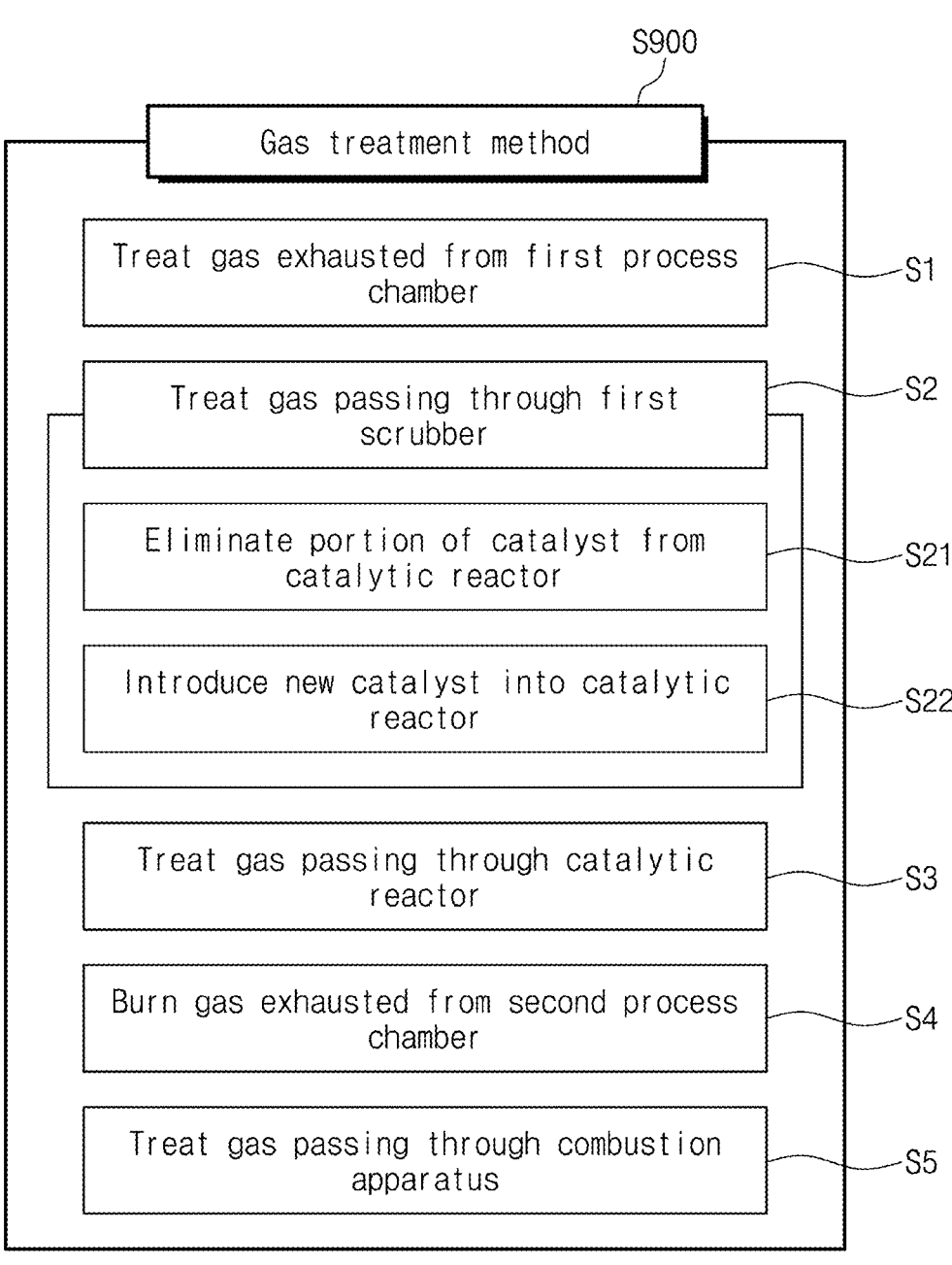
FIG. 9 illustrates a flowchart of a gas treatment method according to embodiments of the disclosure.

FIG. 9 illustrates a flowchart of a gas treatment method according to embodiments of the disclosure.

Referring to FIG. 9, a gas treatment method S900 may be provided. The gas treatment method S900 may refer to a method in which the semiconductor process system ST and the gas treatment system GT discussed with reference to FIGS. 1 to 8 are used to treat a gas. The gas treatment method S900 may include treating a gas exhausted from a first process chamber with, for example, a first scrubber, in operation S1, treating the gas that has passed through the first scrubber with, for example, a catalytic reactor, in operation S2, treating the gas that has passed through the catalytic reactor with, for example, a second scrubber, in operation S3, burning the gas exhausted from a second process chamber with, for example, a combustion apparatus, in operation S4, and treating the gas that has passed through the combustion apparatus with, for example, the catalytic reactor, in operation S5.

The operation S2 may include eliminating a portion of a catalyst from the catalytic reactor in operation S21 and introducing a new catalyst into the catalytic reactor in operation S22.

There may be a change in sequence between the treatment of gas exhausted from the first process chamber and the treatment of gas exhausted from the second process chamber. For example, the treatment of gas exhausted from the first process chamber may be followed by the treatment of gas exhausted from the second process chamber. For another example, the treatment of gas exhausted from the second process chamber may be followed by the treatment of gas exhausted from the first process chamber.

FIGS. 10, 11, 12, 13 and 14 are diagrams of the gas treatment method according to the flowchart of FIG. 9 according to embodiments of the disclosure.

FIGS. 10 to 14 illustrate diagrams showing the gas treatment method according to the flowchart of FIG. 9.

Figure 11:
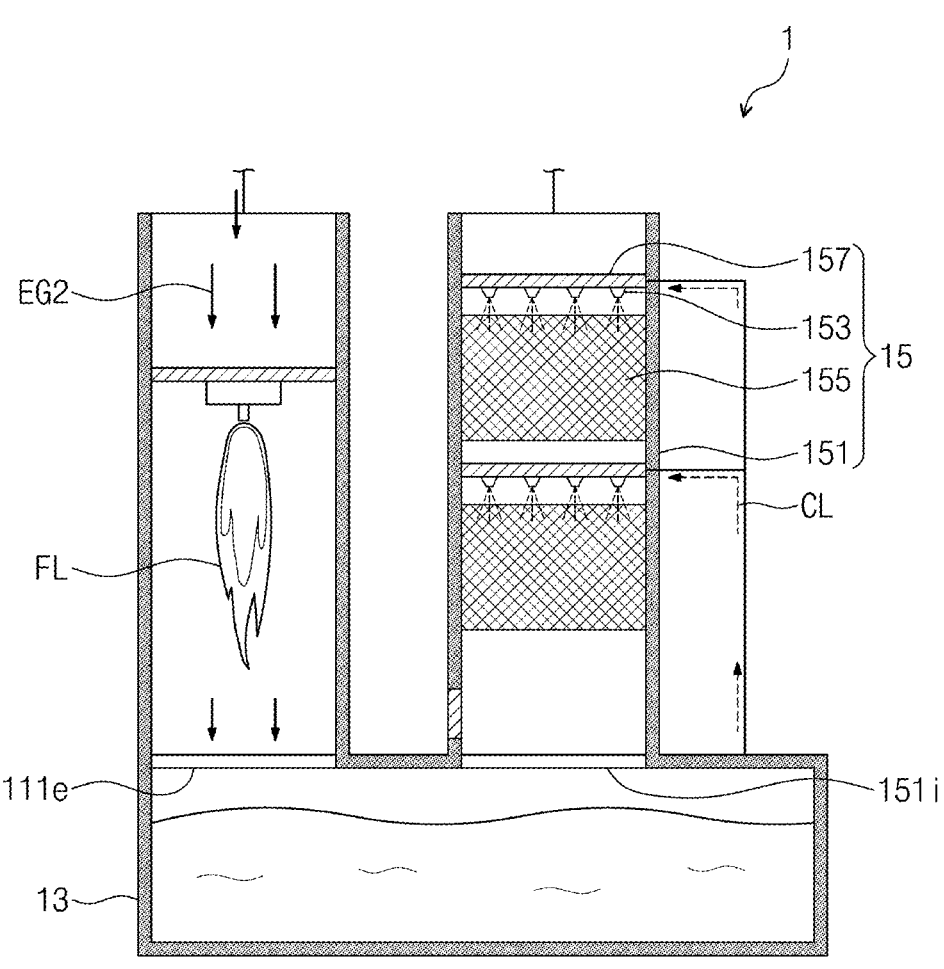

Referring to FIGS. 9, 10, and 11, the operation S4 may include receiving, with the combustion apparatus 1, a gas EG2 exhausted from the second process chamber PC2. The gas EG2 may be burned in the combustion housing 111. For example, in the combustion housing 111, the gas EG2 may be burned by flame FL produced from the burner 113. This procedure may eliminate an inflammable material and/or a toxic material in the gas EG2. A burned gas may be cleaned by cleaning water CL in the cleaning section 15. A gas released from the cleaning section 15 may move to the catalytic reactor 5.

Figure 12:
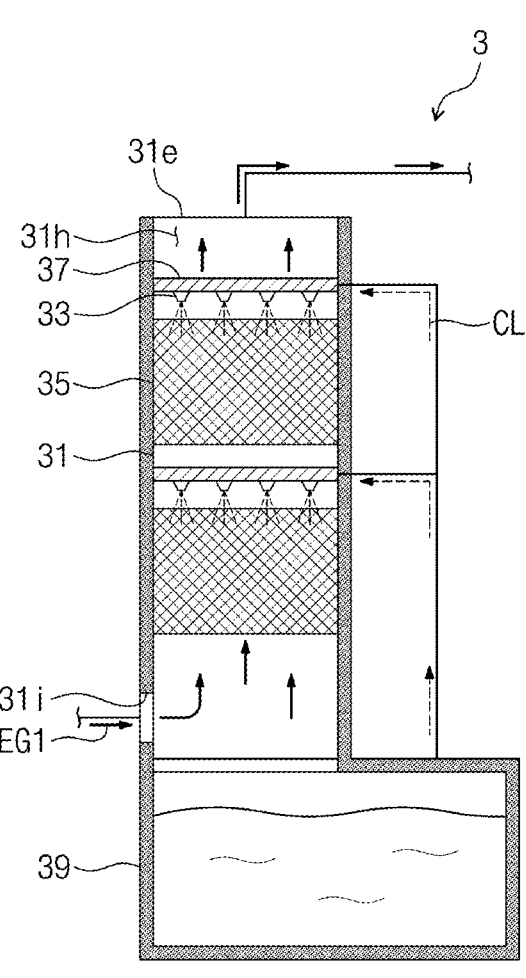
Figure 13:
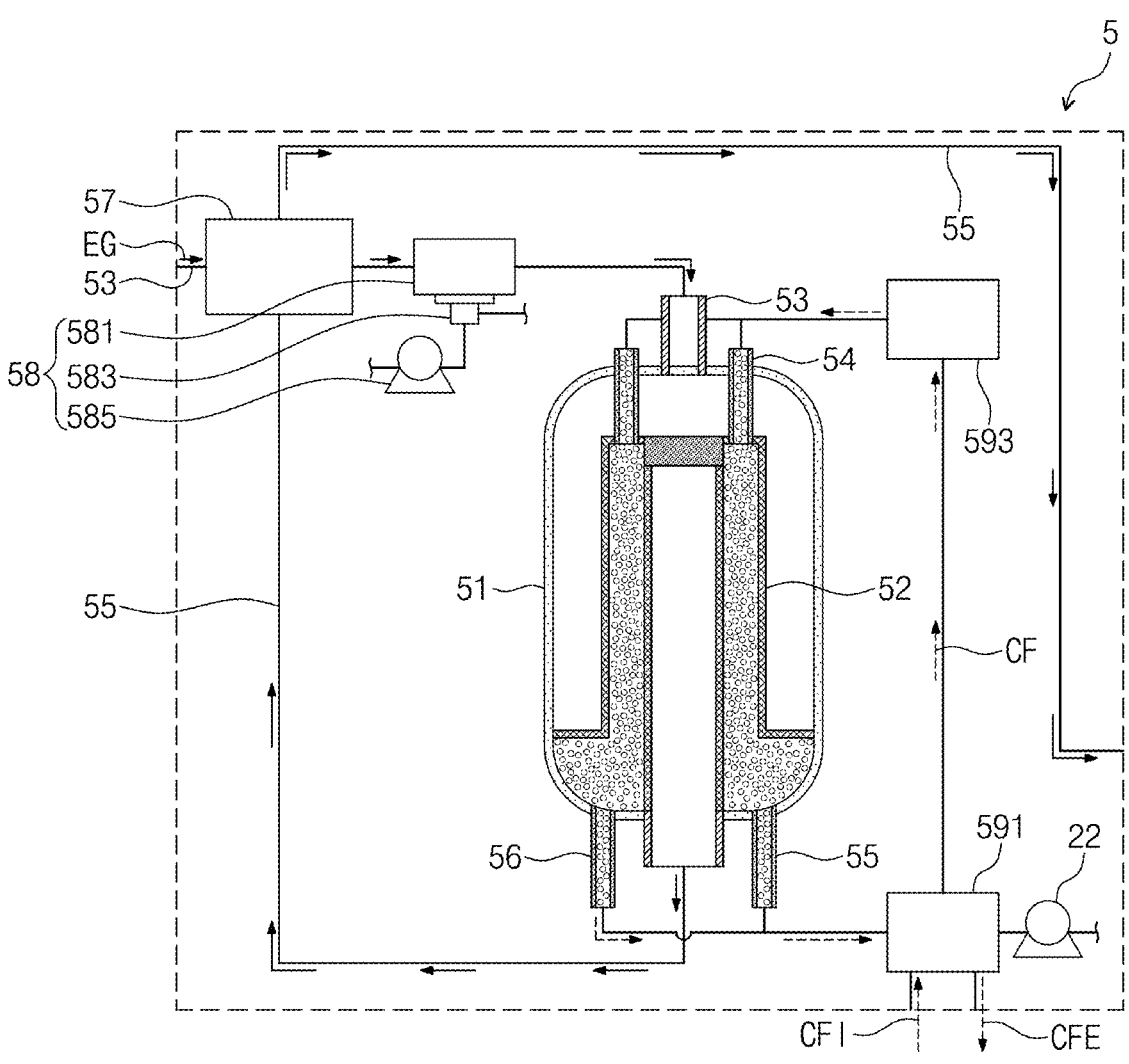
Figure 14:
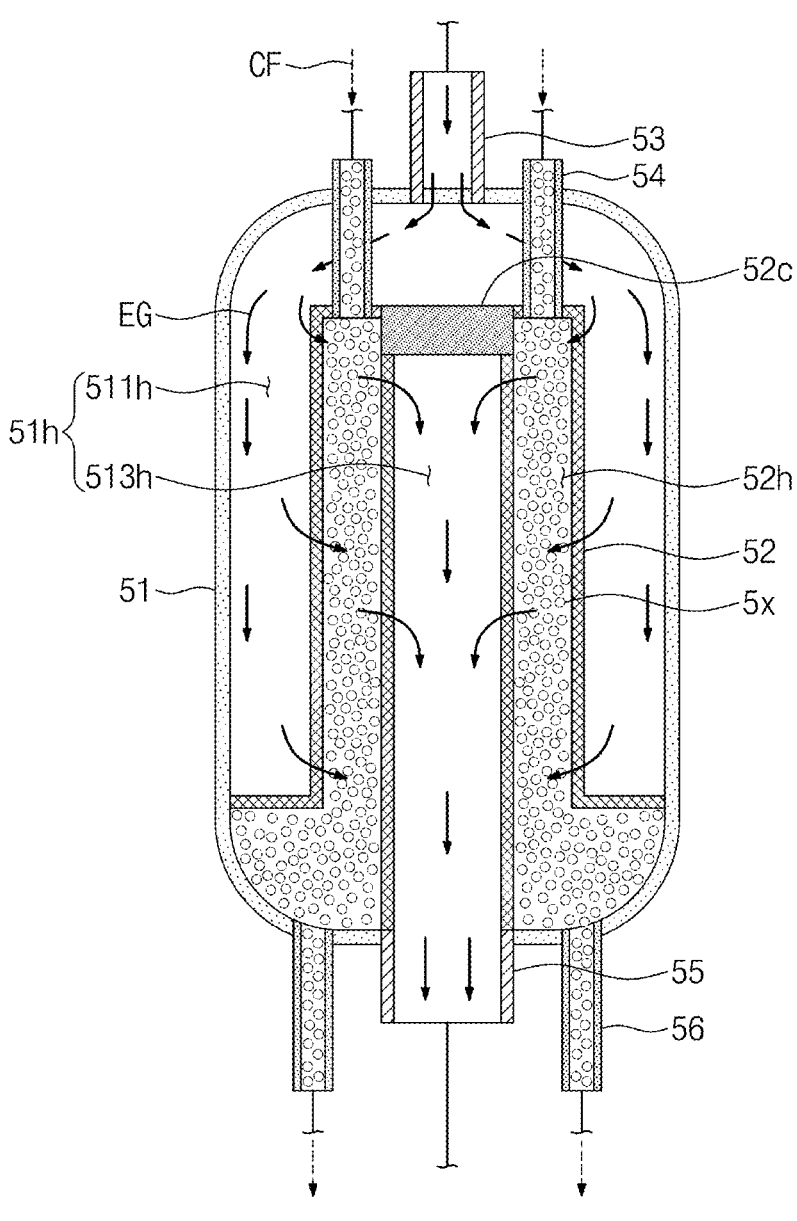

Referring to FIGS. 9, 10, and 12, the operation S1 may include receiving, with the first scrubber 3, a gas EG1 exhausted from the first process chamber PC1. The gas EG1 may be cleaned by the cleaning water CL in the first cleaning housing 31. The cleaning water CL may eliminate HF, HCl, and/or $F_2$ in the gas EG1. A gas released from the first cleaning housing 31 may move to the catalytic reactor 5.

Referring to FIGS. 9, 10, 13, and 14, the operation S2 and the operation S5 may each include pre-heating, with the pre-heater 57, a gas EG. The gas EG moving along the gas inlet line 53 may be pre-heated in the pre-heater 57. For example, the pre-heater 57 may perform heat exchange between the gas EG in the gas inlet line 53 and a gas in the gas outlet line 55. Therefore, the gas EG in the gas inlet line 53 may have an increased temperature. The gas in the gas outlet line 55 may have a reduced temperature.

The gas EG that has passed through the pre-heater 57 may further be heated in the combustion chamber 58. The temperature of the gas EG in the gas inlet line 53 may increase while passing through the combustion chamber 58. The temperature of the gas EG that has passed through may reach a certain value sufficient to react with the catalyst 5$x$ in the catalytic reaction housing 51.

The gas EG that has passed through the combustion chamber 58 may be introduced along the gas inlet line 53 to the catalytic reaction housing 51. First, the gas EG may be introduced into the gas inlet space 511*h*. The gas EG introduced into the gas inlet space 511*h* may pass through the catalyst flow member 52. The gas EG may be treated by the catalyst 5*x*, while passing through the catalyst flow member 52. For example, when the gas EG passes through between the catalysts 5*x*, a PFC in the gas EG may be decomposed. The PFC in the gas EG may be decomposed into HF and/or F2. The gas EG that has passed through the catalyst flow member 52 may be introduced into the gas outlet space 513*h*. The gas EG in the gas outlet space 513*h* may outwardly escape through the gas outlet line 55 from the catalytic reaction housing 51. The gas EG moving along the gas outlet line 55 may have a reduced temperature in the pre-heater 57. Afterwards, the gas EG having a reduced temperature may move to the second scrubber (e.g., 7 of FIG. 10).

The operation S21 may include allowing a portion of the catalyst 5*x* to escape from the catalytic reaction housing 51. The catalyst 5*xd* may move through the catalyst exhaust line 56 to the catalyst mixing apparatus 591. A portion CFE of the catalyst 5*x* in the catalyst mixing apparatus 591 may be eliminated from the catalyst mixing apparatus 591. For example, the portion CFE of the catalyst 5*x* may be eliminated from the catalyst mixing apparatus 591 to outwardly escape from the catalytic reactor 5. This procedure may be performed during a process in which the gas EG is treated.

The operation S22 may include introducing a new catalyst CFI (e.g., a second catalyst) into the catalyst mixing apparatus 591. The new catalyst CFI may be mixed with at least a portion of a catalyst exhausted through the catalyst exhaust line 56 from the catalyst mixing apparatus 591. The mixed catalyst may be introduced into the catalytic reaction housing 51 through the catalyst supply apparatus 593 and the catalyst supply line 54. This procedure may be performed during a process in which the gas EG is treated.

Referring to FIGS. 9 and 10, the operation S3 may include receiving, with the second scrubber 7, a gas that has passed through the catalytic reactor 5. The second scrubber 7 may treat the gas by performing a procedure similar to that discussed with reference to FIG. 12.

According to a gas treatment system, a semiconductor process system including the same, and a gas treatment method using the same in accordance with some embodiments of the disclosure, a catalyst may be exchanged during a gas treatment process. Therefore, facilities may not be stopped to exchange the catalyst due to the end of its lifespan. Accordingly, a gas treatment process may be continuously performed.

According to a gas treatment system, a semiconductor process system including the same, and a gas treatment method using the same in accordance with some embodiments of the disclosure, various kinds of gas exhausted from various types of process chambers may be treated. For example, a PFC that is produced in an etching chamber may be treated. In addition, a nitrogen-based compound, an inflammable material, and/or a toxic material that are produced in a deposition chamber may be treated. A combustion apparatus may be connected to a second process chamber and may burn an inflammable material and/or a toxic material. A catalytic reactor may be used to eliminate remaining materials. Therefore, various kinds of material may be effectively removed.

According to a gas treatment system, a semiconductor process system including the same, and a gas treatment method using the same in accordance with some embodiments of the disclosure, a catalyst may be continuously exchanged to increase gas treatment efficiency. Efficiency of the catalyst may be reduced over time. When the catalyst is continuously exchanged, gases may be treated at constant efficiency.

According to a gas treatment system, a semiconductor process system including the same, and a gas treatment method using the same in accordance with some embodiments of the disclosure, a pre-heater may increase a temperature of gas which will be introduced into a catalytic reactor. An amount of fuel required for a combustion chamber may thus be reduced. In addition, a pre-heater may decrease a temperature of gas exhausted from a catalytic reactor. Therefore, a temperature of gas introduced into a second scrubber may be reduced. The second scrubber may thus be prevented from damage. Moreover, gas treatment efficiency in the second scrubber may be increased.

Figure 15:
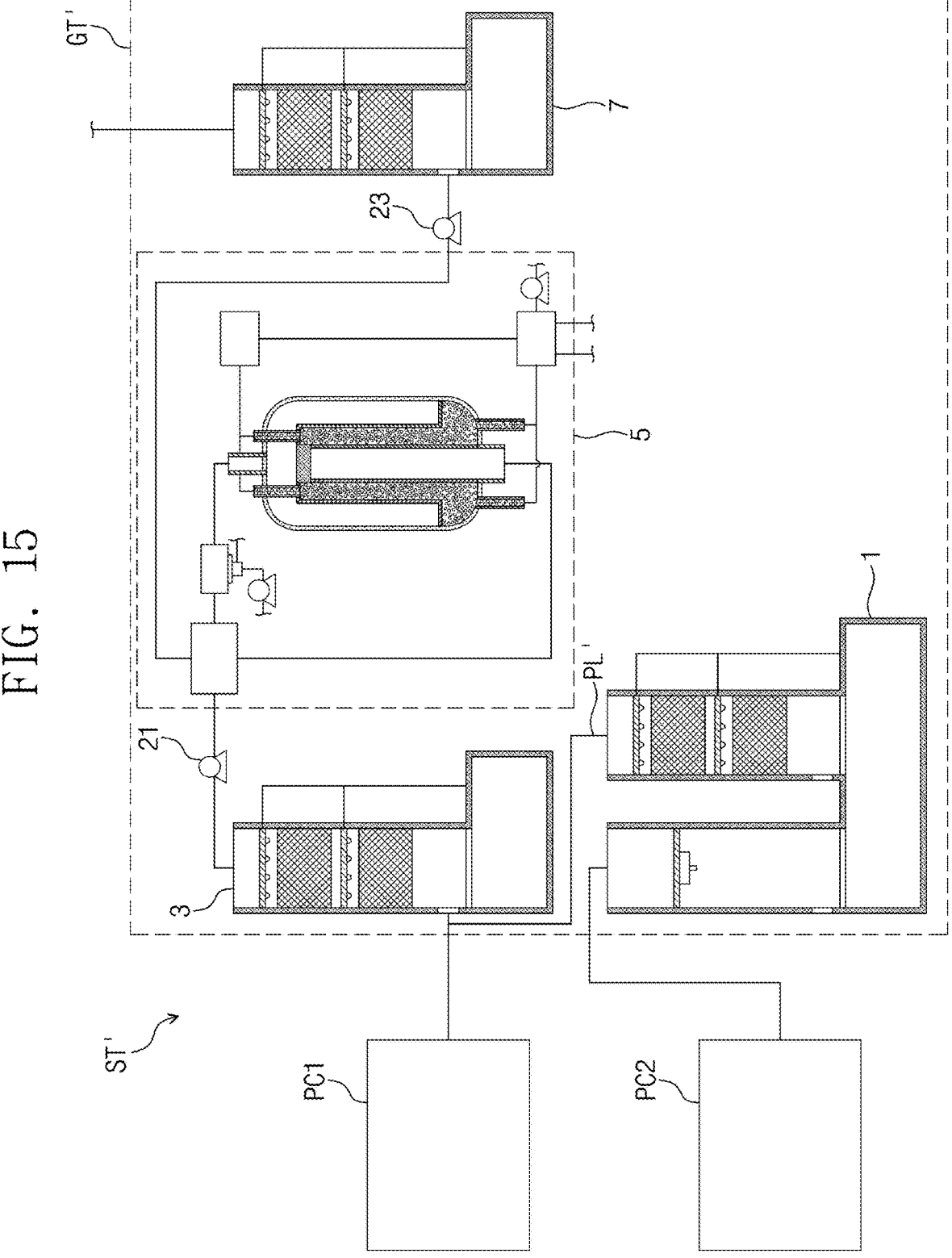
FIG. 15 is a diagram of a semiconductor process system according to embodiments of the disclosure.

FIG. 15 is a diagram of a semiconductor process system according to embodiments of the disclosure.

The embodiment shown in FIG. 15 may include features similar to those in FIGS. 1-14, and repeated description may be omitted.

Referring to FIG. 15, a semiconductor process system ST' may be provided. The semiconductor process system ST' of FIG. 15 may be configured such that the combustion apparatus 1 and the first scrubber 3 are connected to each other. For example, a rear end of the combustion apparatus 1 may be connected through a connection line PL' to a front end of the first scrubber 3. Therefore, a gas burned in the combustion apparatus 1 may be treated in the first scrubber 3.

Figure 16:
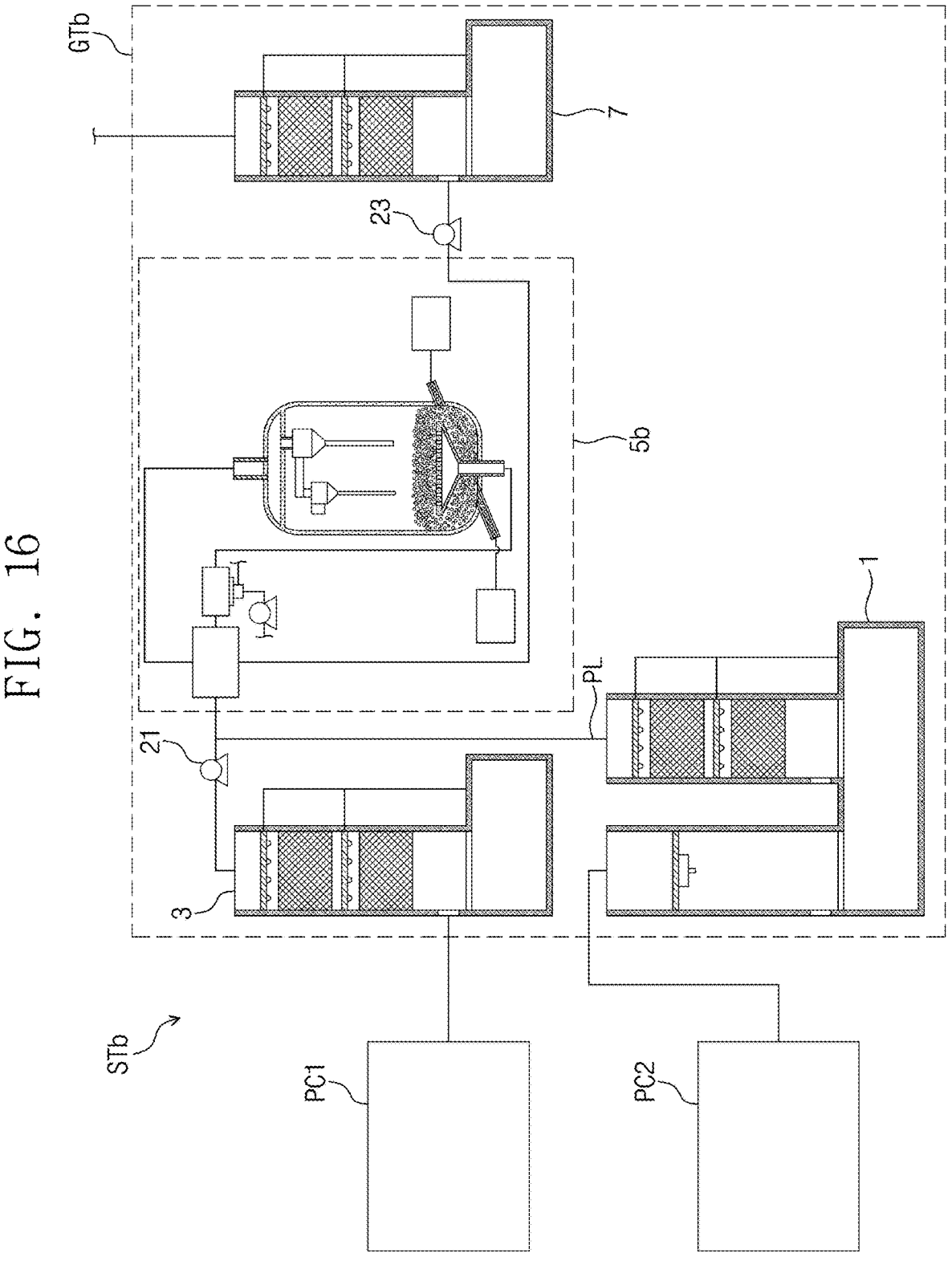
FIG. 16 is a diagram of a semiconductor process system according to embodiments of the disclosure.
Figure 17:
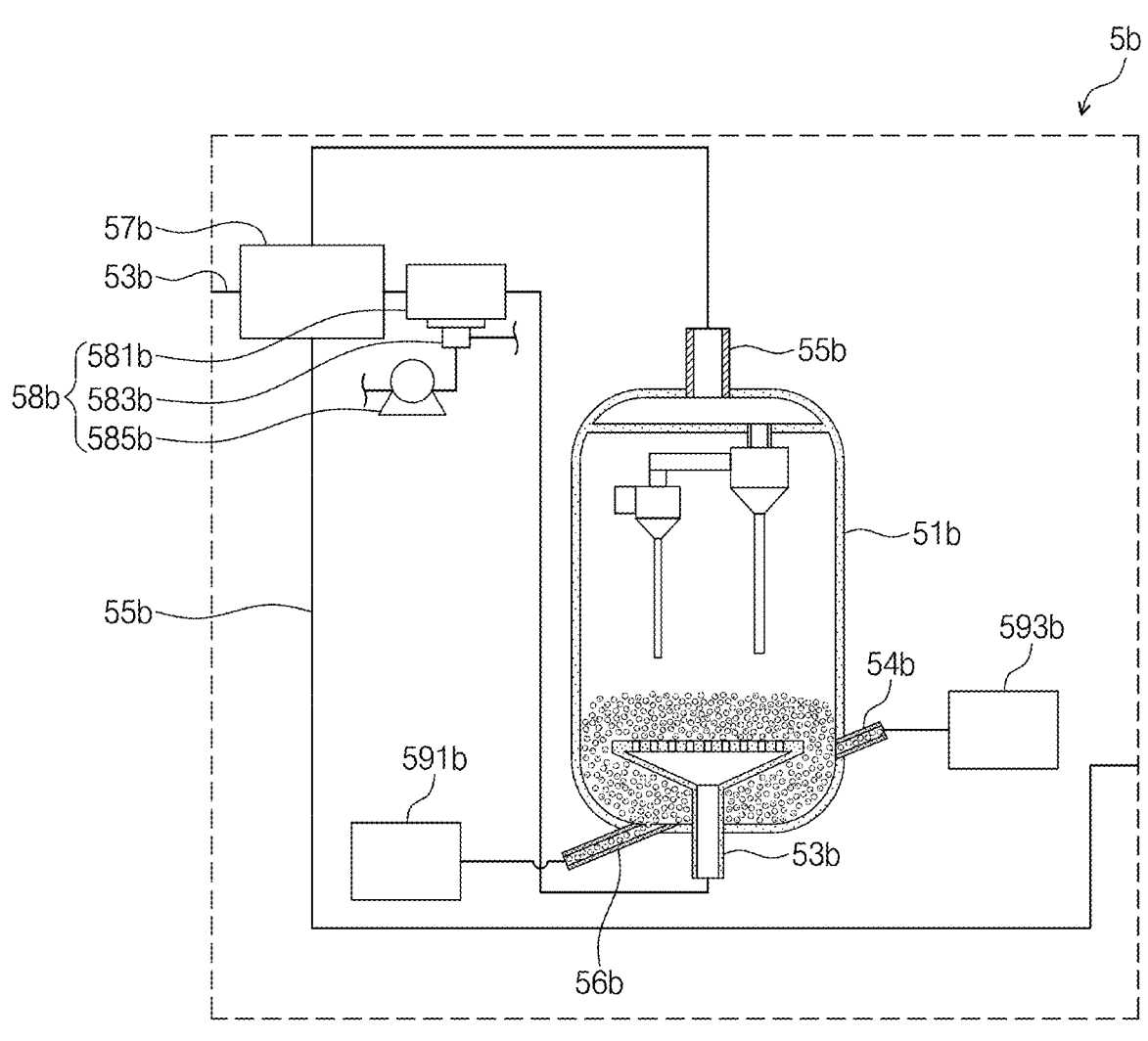
FIG. 17 is a cross-sectional view of a catalytic reactor according to embodiments of the disclosure.
Figure 18:
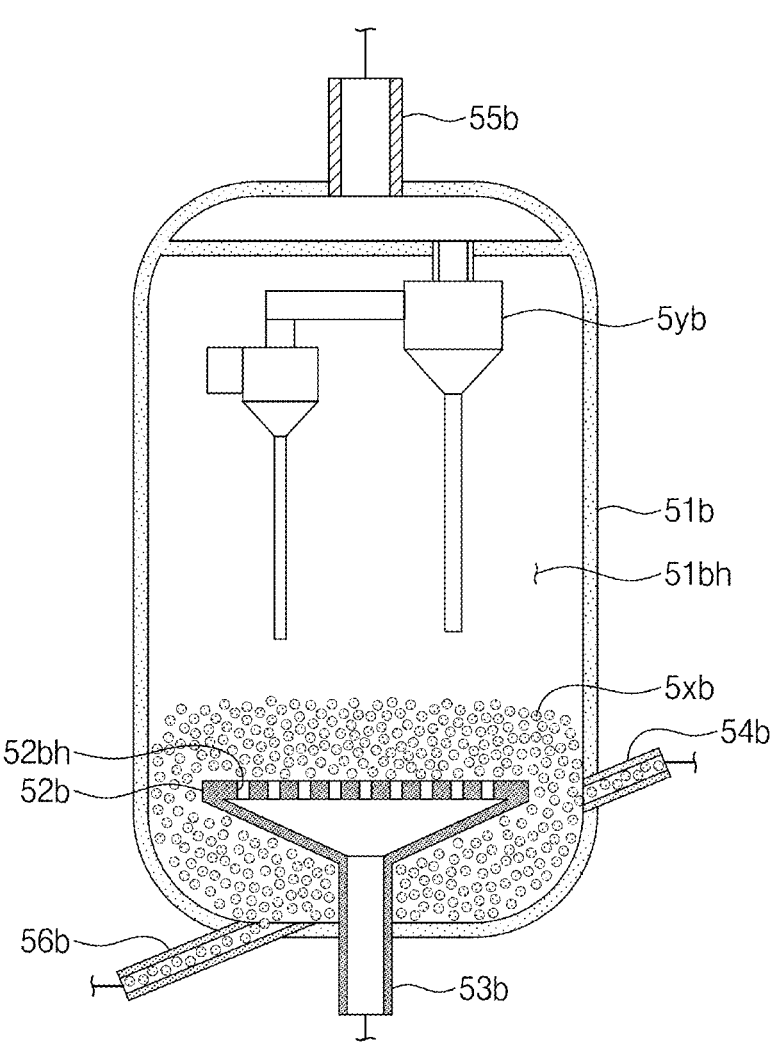
FIG. 18 is a cross-sectional view of a catalytic reactor according to embodiments of the disclosure.

FIG. 16 is a diagram of a semiconductor process system according to embodiments of the disclosure. FIG. 17 is a cross-sectional view of a catalytic reactor according to embodiments of the disclosure. FIG. 18 is a cross-sectional view of a catalytic reactor according to embodiments of the disclosure.

The embodiments shown in FIGS. 16-18 may include features similar to those in FIGS. 1-15, and repeated description may be omitted.

Referring to FIG. 16, a semiconductor process system STb may be provided. The semiconductor process system STb may include a gas treatment system GTb. The gas treatment system GTb may include a catalytic reactor 5*b*.

Referring to FIGS. 17 and 18, the catalytic reactor 5*b* may include a catalytic reaction housing 51*b*, a gas inlet line 53*b*, a gas outlet line 55*b*, a combustion chamber 58*b*, a pre-heater 57*b*, a gas distribution member 52*b*, a catalyst supply line 54*b*, a catalyst exhaust line 56*b*, a catalyst exhaust apparatus 591*b*, a catalyst supply apparatus 593*b*, and a cyclone 5*yb*.

The catalytic reaction housing 51*b* may provide a reaction space 51*bh*. A gas may be treated in the reaction space 51*bh*. A catalyst 5*xb* may be disposed in the reaction space 51*bh*.

The gas inlet line 53*b* may be connected to the catalytic reaction housing 51*b*. For example, the gas inlet line 53*b* may be connected to the catalytic reaction housing 51*b* and thereby connected to the reaction space 51*bh*. As shown in FIG. 18, an end of the gas inlet line 53*b* may be connected to (e.g., integrated with) a lower side of the catalytic reaction housing 51*b*. A gas that has passed through the first scrubber (e.g., 3 of FIG. 16) may be introduced through the gas inlet line 53*b* to the reaction space 51*bh*.

The gas outlet line 55*b* may be connected to the catalytic reaction housing 51*b*. For example, the gas outlet line 55*b* may be connected to the catalytic reaction housing 51*b* and thereby connected to the reaction space 51*bh*. As shown in FIG. 16, an end of the gas outlet line 55*b* may be connected to (e.g., integrated with) an upper side of the catalytic reaction housing 51*b*. A gas may be discharged through the gas outlet line 55*b* from the reaction space 51*bh*.

The combustion chamber 58*b* may be positioned on the gas inlet line 53*b*. The combustion chamber 58*b* may heat a gas that passes through the gas inlet line 53*b*. The combustion chamber 58*b* may include a combustion chamber housing 581*b*, a heating burner 583*b*, and a third blower 585*b*.

The pre-heater 57*b* may be positioned on the gas outlet line 55*b*. For example, the gas outlet line 55*b* may pass through the pre-heater 57*b*. In addition, the pre-heater 57*b* may be positioned on the gas inlet line 53*b*. For example, the gas inlet line 53*b* may pass through the pre-heater 57*b*. Therefore, the gas inlet line 53*b* and the gas outlet line 55*b* may intersect each other in the pre-heater 57*b*.

The gas distribution member 52*b* may be positioned in the catalytic reaction housing 51*b*. The gas distribution member 52*b* may provide a supply hole 52*bh*. For example, the gas distribution member 52*b* may have a baffle-shaped upper plate. A gas coming through the gas inlet line 53*b* may be introduced into the reaction space 51*bh* through the supply hole 52*bh* of the gas distribution member 52*b*.

The catalyst supply line 54*b* may be connected to the catalytic reaction housing 51*b*. For example, the catalyst supply line 54*b* may be connected to a lateral surface of the catalytic reaction housing 51*b*. The catalyst supply line 54*b* may be obliquely connected to the lateral surface of the catalytic reaction housing 51*b*.

The catalyst exhaust line 56*b* may be connected to the catalytic reaction housing 51*b*. For example, the catalyst exhaust line 56*b* may be connected to the lateral surface of the catalytic reaction housing 51*b*. The catalyst exhaust line 56*b* may be obliquely connected to the lateral surface of the catalytic reaction housing 51*b*. The catalyst exhaust line 56*b* may be positioned below the catalyst supply line 54*b*, but the disclosure is not limited thereto.

The cyclone 5*yb* may be positioned in the catalytic reaction housing 51*b*. The cyclone 5*yb* may be connected to the gas outlet line 55*b*. A gas in the reaction space 51*bh* may be discharged through the cyclone 5*yb* from the gas outlet line 55*b*.

According to a gas treatment system of the disclosure, a semiconductor process system including the same, and a gas treatment method using the same, a catalyst may be exchanged during equipment operation to accomplish a continuous operation.

According to a gas treatment system of the disclosure, a semiconductor process system including the same, and a gas treatment method using the same, various kinds of gas exhausted from various types of process chambers may be treated.

According to a gas treatment system of the disclosure, a semiconductor process system including the same, and a gas treatment method using the same, gas treatment efficiency may be increased.

According to a gas treatment system of the disclosure, a semiconductor process system including the same, and a gas treatment method using the same, a temperature of gas before a treatment process may be adjusted.

Effects of the disclosure is not limited to the mentioned above, other effects which have not been mentioned above will be clearly understood to those skilled in the art from the following description.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A gas treatment system, comprising:
a first scrubber configured to treat a gas exhausted from a process chamber;
a catalytic reactor connected to the first scrubber, and configured to treat a gas passing through the first scrubber; and
a second scrubber connected to the catalytic reactor, and configured to treat a gas passing through the catalytic reactor,
wherein the catalytic reactor comprises a fluidized bed reactor, a catalyst flow member configured to provide a catalytic flow space, a catalyst supply line configured to supply a first catalyst to the catalyst flow member, a catalyst exhaust line configured to exhaust the first catalyst from the catalytic flow space, a catalyst mixing apparatus configured to receive the exhausted first catalyst and mix the exhausted first catalyst with a second catalyst to generate a mixed catalyst, and a catalyst supply apparatus configured to receive the mixed catalyst and supply the mixed catalyst to the catalyst supply line.

2. The gas treatment system of claim 1, wherein the catalytic reactor further comprises:
a catalytic reaction housing comprising a reaction space;
a gas inlet line connected to the catalytic reaction housing, and configured to introduce the gas passing through the first scrubber into the reaction space; and
a gas outlet line configured to exhaust the gas introduced into the reaction space.

3. The gas treatment system of claim 2, wherein the catalytic reactor further comprises a combustion chamber on the gas inlet line, and is configured to heat a gas flowing through the gas inlet line.

4. The gas treatment system of claim 3, wherein the catalytic reactor further comprises a pre-heater on the gas outlet line,
wherein the gas inlet line passes through the pre-heater, and
wherein, in the pre-heater, heat exchange is configured to be conducted between a gas in the gas outlet line and a gas in the gas inlet line.

5. The gas treatment system of claim 4, wherein the combustion chamber is located on the gas inlet line at a position that is closer to the catalytic reaction housing than a position of the pre-heater on the gas inlet line, and
wherein the gas passing through the gas inlet line is configured to be introduced into the catalytic reaction housing after sequentially passing through the pre-heater and the combustion chamber.

6. The gas treatment system of claim 2, wherein
the catalyst supply line is connected to the catalytic reaction housing, and
wherein the catalyst exhaust line is connected to the catalytic reaction housing.

7. The gas treatment system of claim 6,
wherein the catalyst flow member is connected to the catalyst supply line and the catalyst exhaust line,

wherein the catalyst flow member comprises a filter structure configured to allow a gas to pass through the filter structure and to prevent a catalyst from passing through the filter structure, and wherein the catalyst flow member divides the reaction space into a gas inlet space and a gas outlet space.

8. The gas treatment system of claim 7, wherein the gas inlet line is connected to the gas inlet space, and wherein the gas outlet line is connected to the gas outlet space.

\* \* \* \* \*